United States Patent
Aga et al.

(10) Patent No.: US 6,998,329 B2
(45) Date of Patent: Feb. 14, 2006

(54) SOI WAFER PRODUCING METHOD, AND WAFER SEPARATING JIG

(75) Inventors: Hiroji Aga, Annaka (JP); Hiroyuki Takahashi, Chikuma (JP); Kiyoshi Mitani, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 74 days.

(21) Appl. No.: 10/483,613

(22) PCT Filed: Jul. 24, 2002

(86) PCT No.: PCT/JP02/07472

§ 371 (c)(1),
(2), (4) Date: Jan. 14, 2004

(87) PCT Pub. No.: WO03/012873

PCT Pub. Date: Feb. 13, 2003

(65) Prior Publication Data

US 2004/0180511 A1    Sep. 16, 2004

(30) Foreign Application Priority Data

Jul. 31, 2001    (JP)    ............................. 2001-231043

(51) Int. Cl.
*H01L 21/30*    (2006.01)
*B65G 49/07*    (2006.01)

(52) U.S. Cl. ...................................... 438/458; 414/935

(58) Field of Classification Search ................ 438/455, 438/458, 459
See application file for complete search history.

(56) References Cited

U.S. PATENT DOCUMENTS

| | | | |
|---|---|---|---|
| 5,240,546 A | 8/1993 | Shiga | |
| 5,863,830 A | 1/1999 | Bruel et al. | |
| 6,527,031 B1 * | 3/2003 | Yanagita et al. | ............ 156/584 |
| 6,809,009 B1 * | 10/2004 | Aspar et al. | ................ 438/459 |

FOREIGN PATENT DOCUMENTS

| | | |
|---|---|---|
| EP | 0 510 706 A2 | 4/1992 |
| EP | 0 961 312 A2 | 12/1999 |
| EP | 0 999 575 A2 | 5/2000 |
| JP | 5-136016 A | 6/1993 |
| JP | 8-97389 | 4/1996 |
| JP | 2000-36583 | 2/2000 |
| JP | 2000-150456 | 5/2000 |
| JP | 2001-94081 | 4/2001 |

* cited by examiner

*Primary Examiner*—Scott Geyer
(74) *Attorney, Agent, or Firm*—Snider & Associates; Ronald R. Snider (57) ABSTRACT

In the process of fabricating an SOI wafer based on the Smart Cut® Process, a stack 34 of an SOI wafer 39 and a residual wafer 38 are separated into the individual wafers using a wafer separation jig 1 of this invention. The wafer separation jig 1 comprises a supporting plane 1p on which the stack 34 is supported in the thickness-wise direction, and a stepped portion 2 disposed on the supporting plane 1p, and having a height adjusted so as to stop movement-by-sliding of the lower wafer of the stack, but so as to allow movement-by-sliding of the upper wafer relative to the lower wafer. Both wafers are separated from each other by inclining the supporting plane 1p with the stack 34 placed thereon, so as to allow the upper wafer to move by sliding as being driven by its own weight in the in-plane direction relative to the lower wafer. This method is successful in effectively suppressing friction between the wafers, and thus in preventing the wafer surface from being scratched.

10 Claims, 8 Drawing Sheets

FIG. 1

PRIOR ART

PRIOR ART

A–A' section

B–B' section

SOI WAFER PRODUCING METHOD, AND WAFER SEPARATING JIG

TECHNICAL FIELD

This invention relates to a method of fabricating an SOI wafer and a wafer separation jig used therefor.

BACKGROUND ART

Bonding method is a well-known representative method for fabricating an SOI wafer (Silicon on Insulator) which comprises an insulating layer such as a silicon oxide film, and a silicon single crystal layer formed as being stacked thereon. Among others, ion implantation delamination method, so-called Smart Cut® Process (registered trademark) has been attracting a public attention, in which a silicon single crystal is implanted with ions and then annealed, so as to partially break the crystal lattice of silicon at the layer where the implanted ions reside, to thereby form an SOI layer.

Figure 1:
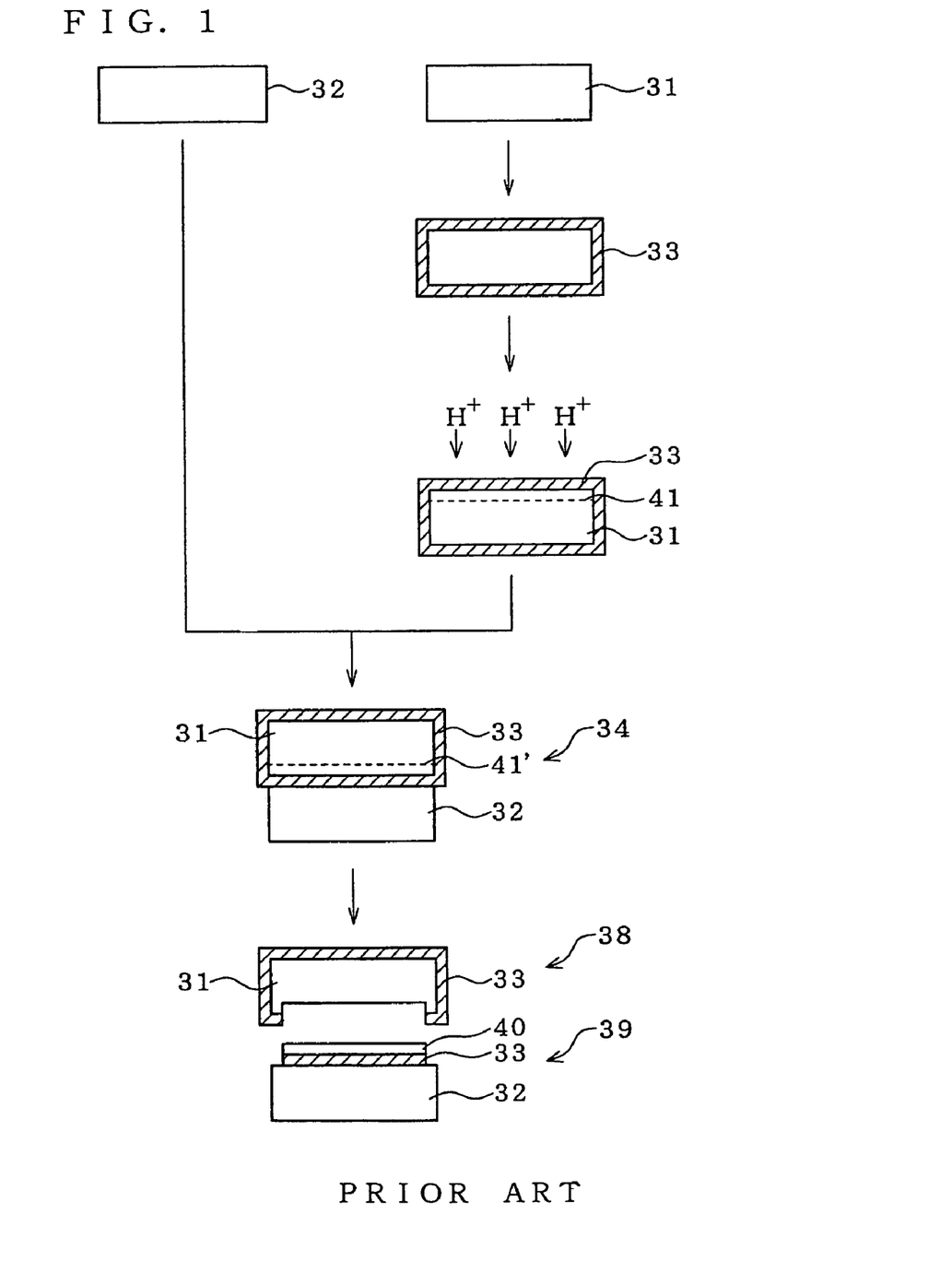
FIG. 1 is an explanatory drawing of fabrication processes of an SOI wafer based on the Smart Cut® Process.

In the Smart Cut Process® shown in FIG. 1, a bond wafer 31 having an ion implanted layer 41 formed therein and a base wafer 32 on which an SOI layer 40 is to be formed later are annealed as being closely contacted with each other while placing in between an insulating film 33 such as an oxide film which composes the surficial portion of the bonding-side main surface of at least either one of the wafers. By the annealing, the surficial portion of the bonding-side main surface of the bond wafer 31 is delaminated at the ion implanted layer 41 so as to form the SOI layer 40, and is bonded to the base wafer 32 to thereby obtain an SOI wafer 39.

Figure 7:
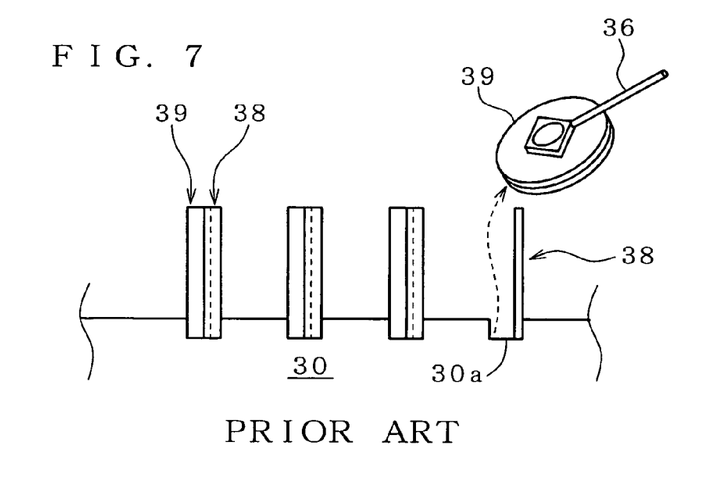
FIG. 7 is a drawing for explaining a conventional method of recovering an SOI wafer.

In the above-described fabrication process, a conventional method of separating a residual wafer 38, which is a residue of the bond wafer 31, from the SOI wafer 39 was proceeded as described below. As shown in FIG. 7, each of holding grooves 30a of a boat 30 drawn out of a furnace after the annealing holds the residual wafer 38 and the SOI wafer 39 as being stacked with each other. The residual wafer 38 or the SOI wafer 39 is recovered while being chucked by a vacuum chuck 36 on the back surface thereof.

Use of the vacuum chuck as shown in FIG. 7, however, makes it difficult to separate both wafers while keeping a parallel positional relation so as to avoid contact therebetween. Any accidental friction between both wafers to be separated may result in scratching on the surface. The scratching in particular on the SOI wafer is undesirable because it may result in a lowered yield ratio.

It is therefore a subject of this invention to provide a method of fabricating an SOI wafer without causing scratches on the wafer surface, and a wafer separation jig used therefor.

DISCLOSURE OF THE INVENTION

In view of solving the above-described subject, a method of fabricating an SOI wafer comprises:

an SOI wafer forming step for forming an SOI wafer by annealing the bond wafer having an ion-implanted layer formed therein and a base wafer on which an SOI layer is to be formed later, as being closely contacted with each other while placing in between an insulating film which composes the surficial portion of the bonding-side main surface of at least either one of the wafers, to thereby delaminate the surficial portion of the bonding-side main surface of the bond wafer at the ion implanted layer so as to form the SOI layer, and is bonded to the base wafer to thereby obtain an SOI wafer; and a wafer separation step in which a stack of the SOI wafer and the residual wafer which is a residue of the bond wafer after causing delamination, obtained in the SOI wafer forming step, is held so as to direct one wafer upward and the other wafer downward, and the upper wafer is then slid in the in-plane direction relative to the lower wafer, to thereby separate both wafers from each other.

This invention is a method of fabricating a bonded SOI wafer based on the Smart Cut® Process in which the SOI layer is formed by ion implantation as described in the above, and specially designed so that the separation of the SOI wafer and the residual wafer after the annealing is actualized by allowing one wafer to slide in the in-plane direction relative to the other. This method is successful in suppressing scratching due to contact between the wafers. Because the SOI wafer and the residual wafer can surely be separated without causing scratches, the yield ratio in the fabrication can be improved.

A reason why both wafers never cause friction can be explained as below. The annealing for delamination of the wafers in the Smart Cut® Process gasifies the ions which reside in the ion implanted layer, and breaks the silicon bond to thereby generate a crack (delamination). This forms a micro-gap between the SOI wafer and the residual wafer. This gap successfully allows one wafer to move by sliding relative to the other wafer while almost preventing both wafers from causing friction with each other.

As one specific method of realizing the movement-by-sliding, it is allowable to adopt a method in which only a lower wafer is held as being immobilized, and the stack is inclined so as to allow an upper wafer to move by sliding as being driven by its own weight. Delamination is caused and then the micro-gap is formed almost over the entire area of the ion implanted layer after the annealing, whereas, in a tiny area in the outer circumferential portion of the wafers where polishing sag occurs, the delamination does not extend, and instead remains as a terrace-like bonded portion contributable to the bonding of the wafers. The force of this bonding is, however, extremely small, so that only the inclination while keeping the lower wafer immobilized result in sliding of the upper wafer as being driven by its own weight, and in the separation of both wafers. Because only the inclination for sliding suffices, it is no more necessary to use an expensive tool such as a vacuum chuck, and operations needed therefor are extremely simple.

Meanwhile, as a support used in the method of fabricating an SOI wafer of this invention, a jig as described below is available. That is, the wafer separation jig of this invention is such as being used for separating a stack composed of a pair of wafers stacked with each other, comprising a supporting plane on which the stack is supported in the thickness-wise direction, and a first stopper disposed on the supporting plane and having a height adjusted so as to stop movement-by-sliding of a lower wafer of the stack relative to the jig, but so as to allow movement-by-sliding of an upper wafer relative to the lower wafer, and configured so as to allow both wafers to separate from each other when inclined with the stack placed on the supporting plane thereof so as to allow the upper wafer to move by sliding as being driven by its own weight in the in-plane direction relative to the lower wafer.

Use of the wafer separation jig of this invention makes it possible to readily separate, for example, the aforementioned stack comprising the SOI wafer and the residual wafer into the individual wafers without causing scratches on the major surfaces thereof, and to improve the yield ratio in the fabrication more than use of a vacuum chuck.

BEST MODES FOR CARRYING OUT THE INVENTION

The following paragraphs will describe an embodiment of this invention referring to the drawings.

The method of fabricating an SOI wafer of this invention is a method based on the Smart Cut® Process as described in the above. The Smart Cut® Process is as shown in FIG. 1.

First, two silicon single crystal wafers 31, 32 are obtained, and subjected to the following processes. On the main surface of at least either one of these wafers, an oxide film 33 is preliminarily formed by a publicly-known method of forming silicon oxide film such as thermal oxidation process, CVD process and so forth. The oxide film 33 can possibly be substituted by a silicon nitride film, but the silicon oxide film is the best choice for its excellent insulating property and easiness in the formation. At least one element selected from light-weight elements consisting of hydrogen, rare gas and halogen is ionized, and implanted into the silicon single crystal wafer 31 (bond wafer) from the main surface side, to thereby form an ion implanted layer 41 inside thereof. The other wafer is referred to as the base wafer 32 on which an SOI layer 40 is to be formed.

Next, the base wafer 32 and the bond wafer 31 are closely contacted while placing the oxide film 33 formed on the main surface portion on the bonding side in between, and annealed at approximately 400 to 600° C. By the annealing, a delamination layer 41' is formed at the ion implanted layer 41, and the SOI layer 40 is formed in a form bonded to the base wafer 32. The formation process of the SOI wafer thus completes.

The delamination layer 41' is produced after the silicon bonds are broken by the lightweight element contained in the ion implanted layer 41 and gasified by the annealing. During the annealing, a bonding process of the SOI layer 40 to the base wafer 32, and a delamination process of the SOI layer 40 from the bond wafer 31 proceed at the same time. After the annealing, the residual wafer 38 and the SOI wafer 39 are kept in a stacked form with the aid of an extremely weak bonding force exerted at the terrace-like residual portion remained undelaminated. In order to realize a stronger bonding between the base wafer 32 and the SOI layer 40, it is also preferable, after recovery of the SOI wafer 39, to carry out annealing at a temperature higher than that in the annealing in the Smart Cut® Process, for example at 1,100 to 1,200° C. or around.

Figure 2A:
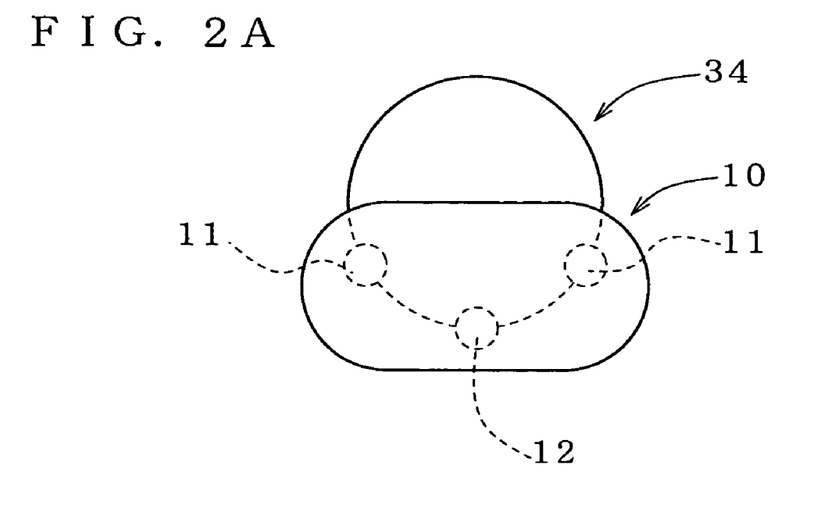
FIG. 2A is a sectional view of a boat used for the annealing taken along the line parallel to a wafer.
Figure 2B:
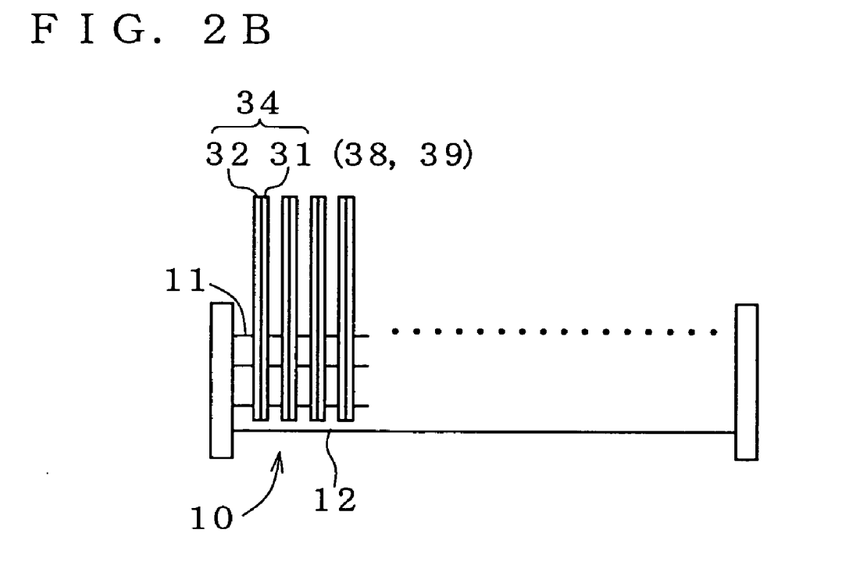
FIG. 2B is a sectional view of a boat used for the annealing taken along the line parallel to the direction of arrangement of the wafers.

FIG. 2 show schematic sectional views of a quartz-made boat 10 on which the wafers are held to be introduced into the annealing furnace. FIG. 2A is a sectional view taken along the line parallel to the wafer, and FIG. 2B is a sectional view taken along the line parallel to the direction of arrangement of the wafers. The bond wafer 31 and the base wafer 32 are kept in a close contact by the boat 10 which support them at three supporting portions 11, 11, 12, and are introduced into the annealing furnace. The boat 10 configured as shown in FIG. 2 can afford batch processing of a considerable number of the wafers, and is thus excellent in the productivity. On the other hand, the wafers have to be recovered one by one through chucking for the succeeding wafer separation step which comes after the formation of the SOI wafer, but this inevitably results in mutual contact of the wafers, and tends to cause scratching.

In this invention, the separation of the wafers without using the chuck proceeds as follows. First, the stack 34 of the SOI wafer 39 and the residual wafer 38 which is a residue of the bond wafer 31 after causing delamination, obtained in the SOI wafer forming step, is held so as to direct one wafer upward and the other wafer downward, and the upper wafer is then slid in the in-plane direction relative to the lower wafer. That is, these two wafers are recovered in a combined manner from the status as being held on the boat 10, and are then separated. This is successful in effectively suppressing the generation of the scratches caused by friction of the wafers during the separation thereof.

In the above-described wafer separation step, it is preferable to support the SOI wafer 39 as the immobilization side, and to allow the residual wafer 38 to move by sliding as the upper wafer. This is preferable because nothing will be brought into contact with the main surface of the SOI wafer 39 on which the SOI layer 40 is formed after separation of the both.

One specific means for allowing the wafer to move by sliding is preferably such as inclining the stack 34 while holding only the lower wafer in an immobilized manner, by which the upper wafer can move by sliding as being driven by its own weight. Because inclination of the stack 34 is an only necessary process, all equipment and tools required in the process can extremely be simplified.

Figure 6A:
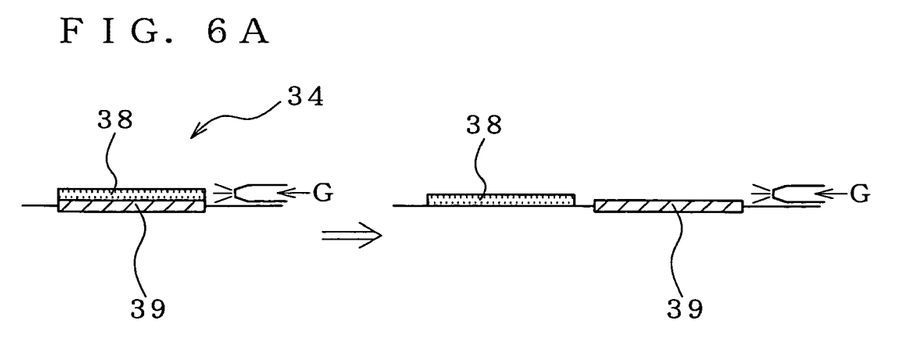
FIG. 6A is a drawing for explaining an embodiment in which an upper wafer is allowed to move by sliding with the aid of blowout of gas while holding the stack in a nearly horizontal manner.
Figure 6B:
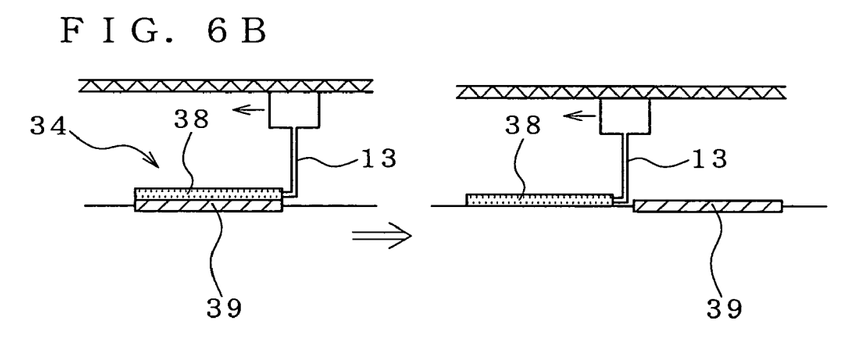
FIG. 6B is a drawing for explaining an embodiment in which only an upper wafer, held similarly to as shown in FIG. 6A, is pushed by an arm in the horizontal direction so as to allow it to move by sliding.

It is also allowable to adopt a method shown in FIG. 6A, in which the stack 34 is placed so as to fit itself to a recess having a depth shallower than the lower wafer, and a gas G is blown in the in-plane direction of the wafer to thereby allow the upper wafer to move by sliding. It is still also allowable to adopt a method shown in FIG. 6B, in which an arm 13 having a fine positional adjustment mechanism is operated in the status shown in FIG. 6A, so as to push only the upper wafer in the direction from the circumferential portion towards the center.

Figure 3:
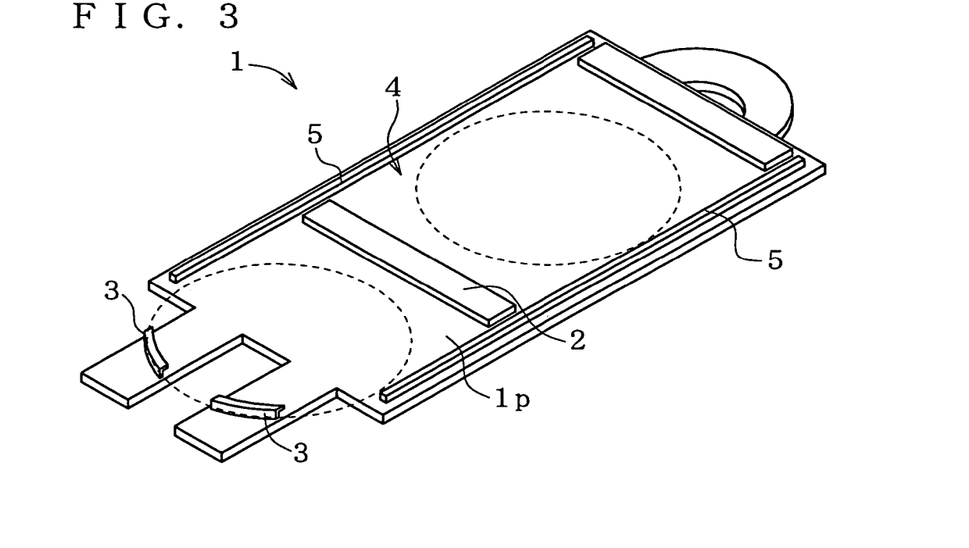
FIG. 3 is a full view of a wafer separation jig of this invention.

A wafer separation jig 1 shown in FIG. 3 is preferably used in the step of separating the SOI wafer 39 and the residual wafer 38 by inclining the stack 34 as described in the above. The wafer separation jig 1 has a plate form as a whole, and comprises a supporting plane 1p on which the stack 34 is supported in the thickness-wise direction, and a first stopper disposed on a supporting plane 1p on which the lower wafer of the stack is supported, and has a height adjusted so as to stop movement-by-sliding of the lower wafer of the stack 34 relative to the jig 1. By inclining the jig 1 while placing the stack 34 on the supporting plane 1p thereof, the upper wafer can move by sliding as being driven by its own weight in the in-plane direction relative to the lower wafer, and can be separated from the other.

As shown in FIG. 3, the first stopper can be configured as a stepped portion 2 typically having a height smaller than the thickness of the lower wafer. In this configuration, movement-by-sliding of the lower wafer is stopped by the stepped portion 2 so as to hitch the lower wafer thereon, and only the upper wafer is allowed to move by sliding in the direction of inclination. Because the stepped portion 2 is brought into contact only with the circumference of the lower wafer, there is no apprehension of scratching the wafer surface.

Moreover, there is provided a second stopper which is disposed so as to oppose with the first stopper (stepped portion 2) while placing the region for holding the lower wafer in between, and is intended for stopping sliding down of the stack 34 when inclined into the direction opposite to that for the wafer separation. The second stopper can be configured as hooked portions 3 adjusted so as to hold the stack 34 on the inner side thereof. The stack 34 is engaged with the hooked portions 3 so as to fit the circumferential portion thereof while leaving an appropriate clearance, and this allows direct recovery of the stack 34 from the above-described boat 10.

The wafer separation jig 1 further comprises a recovery portion 4 for recovering and holding the upper wafer after being separated, so as to be disposed on the downstream side of the stepped portion 2 in the direction of inclination for the separation, in a form extended from the region for holding the lower wafer. After the separation, the upper wafer and the lower wafer remain on the recovery portion 4 and on the opposite side (position of support of the stack 34) beyond the stepped portion 2, respectively, and this facilitates independent recovery of the wafers by types. The wafer separation jig 1 is also provided with guides 5 on both edges, and this is successful in eliminating fear of falling of the wafers even if the jig is inclined to some extent in any direction other than a predetermined direction of inclination.

Figure 9A:
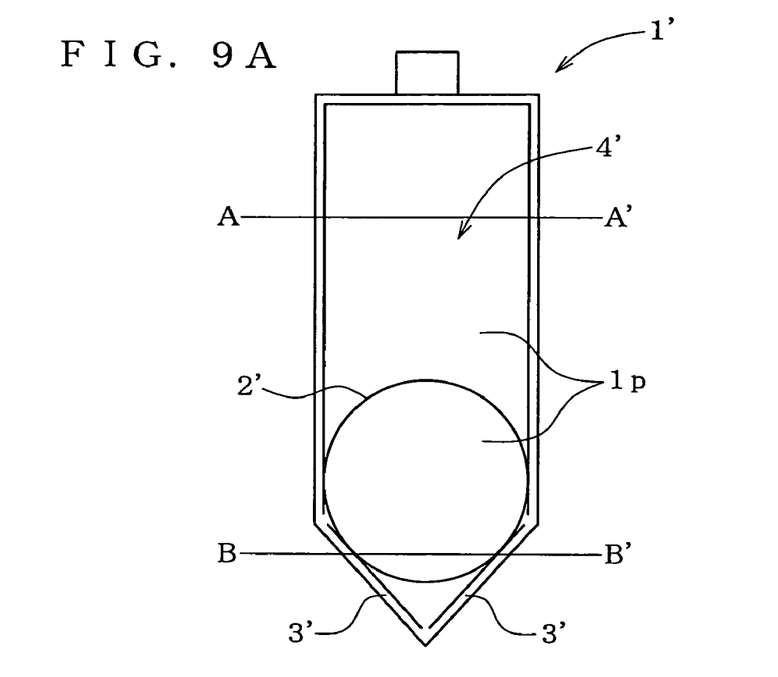
FIG. 9A is a drawing of another embodiment of the wafer separation jig.
Figure 9B:
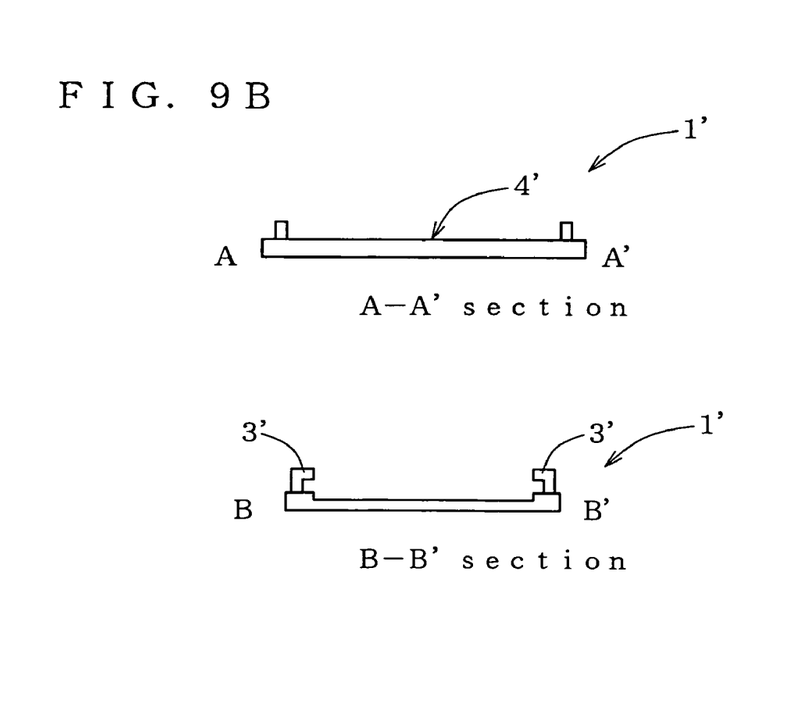
FIG. 9B is a sectional view of FIG. 9A.

FIG. 9A is a drawing of another embodiment of the wafer separation jig 1'. In the separation jig 1', a circular stepped portion 2', which is formed on the supporting plane 1p and has a depth smaller than the thickness of the lower wafer, functions as the first stopper. As shown in the sectional view (FIG. 9B), as being bounded by the stepped portion 2', the highland side serves as a wafer recovery portion 4' into which the upper wafer is to be recovered, and hooked portions 3' which function as the second stopper are provided on the lowland side. Geometry of the wafer separation jig 1', that is, geometry of the hooked portions 3' is adjusted so as to facilitate the recovery of the stack 34 from the boat or a susceptor.

Figure 4:
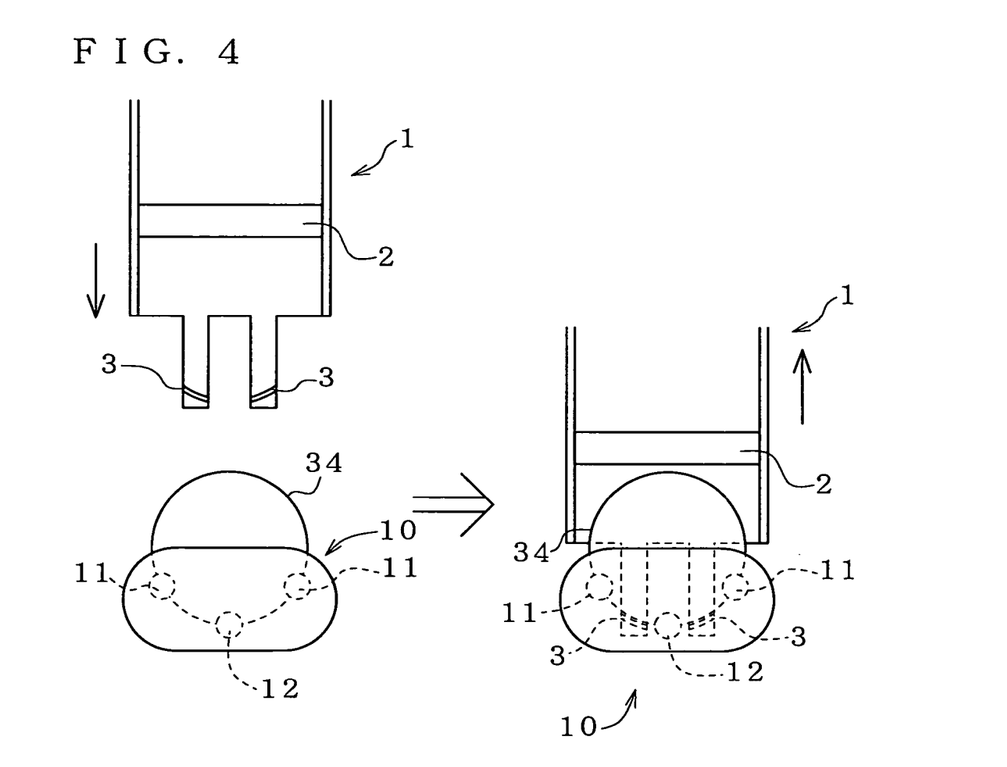
FIG. 4 is a schematic drawing for showing a process of recovering the stack of the residual wafer and the SOI wafer from a boat after the annealing, using the wafer separation jig of this invention.
Figure 5:
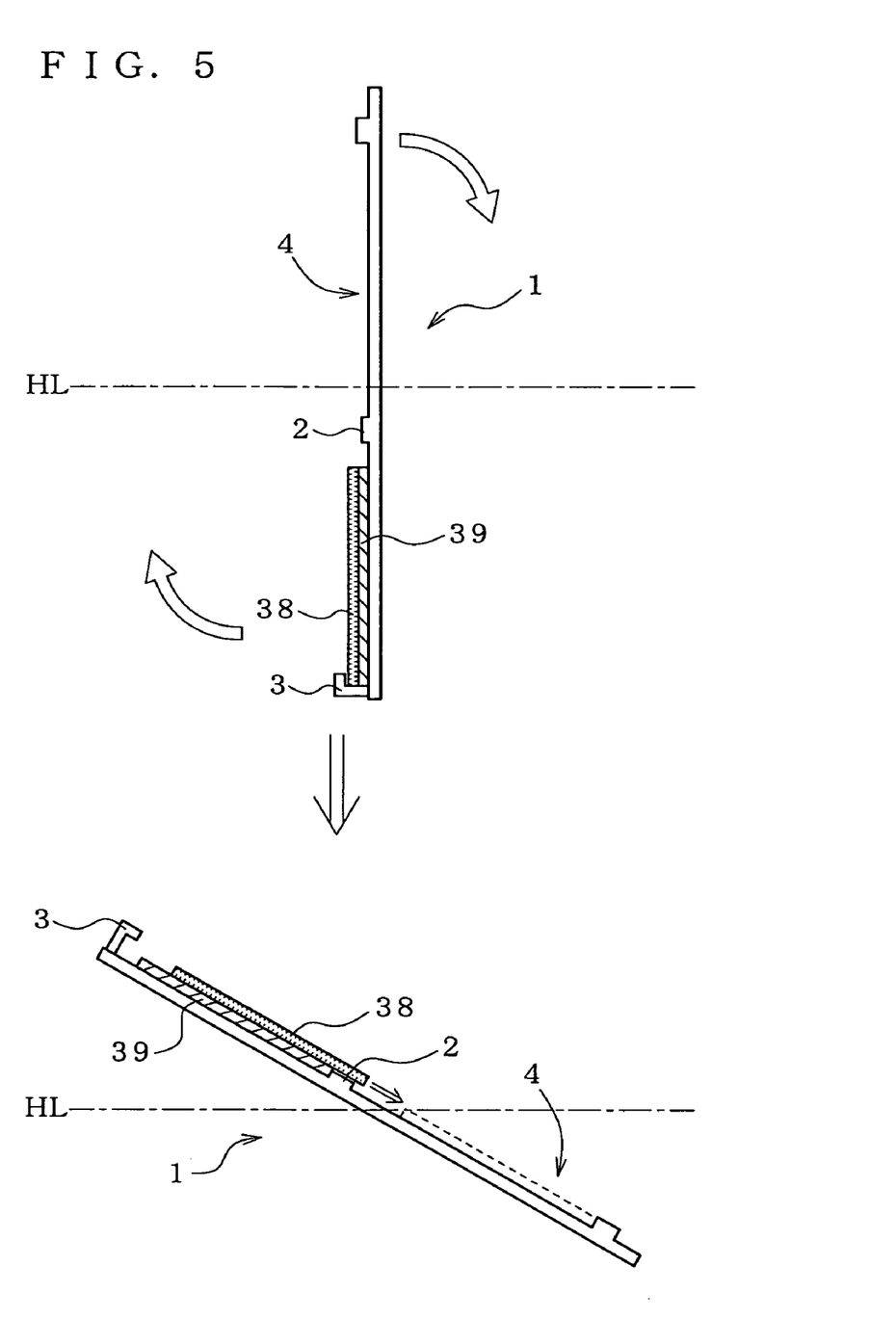
FIG. 5 is a schematic drawing showing an embodiment in which the wafers after the annealing are separated using the wafer separation jig of this invention.

FIG. 4 is a schematic drawing for showing a process of recovering the stack 34 from the boat 10 using the wafer separation jig 1 shown in FIG. 3. First, the plate-formed wafer separation jig 1 is allowed to approach from the SOI wafer 39 side, while keeping it generally in parallel with the wafers (stack 34) held on the boat 10. The wafer separation jig 1 forks into two branches on the hooked potion 3 side, and this makes it possible to insert the hooked portion 3 into the space between the center supporting portion 12 and supporting portions 11 on both sides of the boat 10. The wafer separation jig 1 is then descended so that the hooked portions 3 are positioned slightly lower than the lower end of the stack 34. The stack 34 is then engaged with the jig, in a form that the lower circumferential portion of the stack 34 is hooked by the hooked portions 3, and is elevated while keeping this status. Next, as shown in FIG. 5, the jig is then gradually inclined with respect to the horizontal line HL while directing the recovery portion 4 downward. During the operation, the residual wafer 38, as the upper wafer, moves by sliding over the stepped portion 2 to reach the recovery portion 4.

Figure 8:
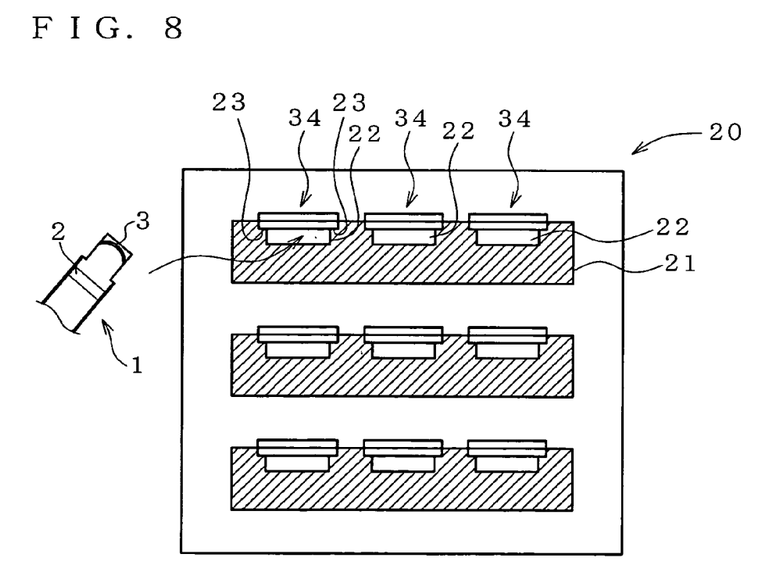
FIG. 8 is a drawing for explaining a method of recovering the stack annealed in an oven-type annealing furnace.

On the other hand, as shown in FIG. 8, for the case where the annealing is carried out in an oven-type annealing furnace 20, the stacks 34 are held by a susceptor 21 in a near horizontal manner, and are preferably recovered while keeping this status. For example, preliminarily provision, to the susceptor 21, of pockets 23 for holding the wafers and open spaces 22 for allowing the wafer separation jig 1 to be inserted therein below the stacks 34 is preferable because this helps the stacks 34 after the annealing to be transferred to the wafer separation jig 1 as being ladled up from the bottom, and allows a smooth conveyance towards the wafer separation step.

The wafer separation jig 1 in this embodiment is composed of an acrylic resin plate for its inexpensiveness and workability, but possible materials for composing the jig 1 include not only other resin materials such as fluorine-containing resin, but also quartz and SiC in view of preventing contamination into the wafers. As an alternative for the embodiment having the stepped portion 2, a possible example of the immobilization style of the lower wafer relates to a concept that the lower wafer is positioned and held based on friction resistance with the supporting plane 1p even if the stack 34 is inclined and the upper wafer starts to move by sliding. This is specifically realized by, for example, a method of adhering a sheet-type material having a large friction resistance on the supporting plane 1p, and a method of subjecting the supporting plane 1p to roughening for increasing the friction resistance. These methods are also advantageous because the stepped portion 2 will be omissible.

EXAMPLE

Figure 10A:
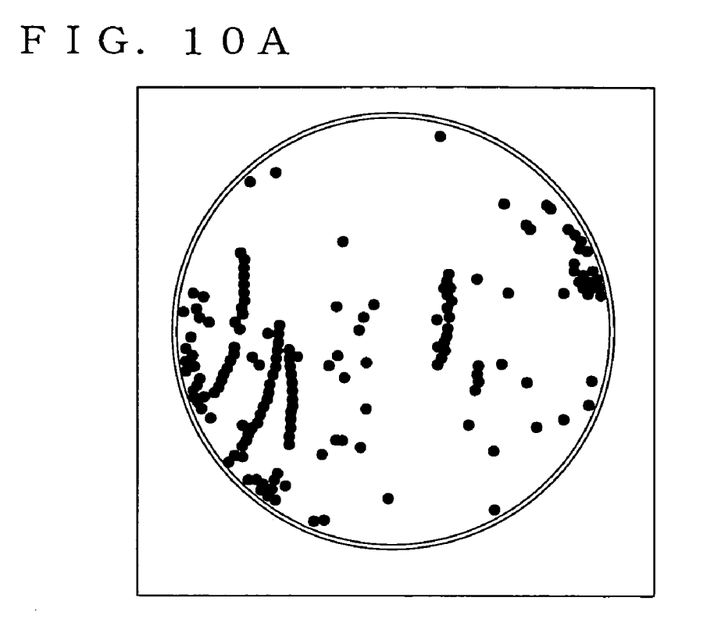
FIG. 10A is a drawing showing results of the surface inspection of the SOI wafer obtained by the conventional separation method.

Experiments described below were carried out to confirm the effects of this invention. First, silicon single crystal wafers having a crystal orientation of the main surface of (100), a resistivity of 10 Ω·cm, and a diameter of 200 mm were obtained, and a plurality of SOI wafers 39 were fabricated according to the method shown in FIG. 1. The thickness of the oxide film 33 on the bond wafer 31 was 145 nm, and through which $H^+$ ions were implanted under the conditions of an acceleration voltage of 56 keV and a dosage of $5.5 \times 10^{16}$ cm$^{-2}$. Under these conditions, the SOI layer 40 of approximately 340 nm thick was formed. The annealing was carried out using the boat 10 having a form as shown in FIG. 2, and in an inert atmosphere of an Ar/N$_2$ mixed gas at 500° C. for 30 minutes. The boat 10 was then taken out from the annealing furnace, and the SOI wafers 39 and the residual wafers 38 were separated and recovered according to the method of using the vacuum chuck 36 as shown in FIG. 7. The recovered SOI wafers 39 were then further annealed for 2 hours at 1,100° C., and were polished on their surfaces (Polishing stock removal was 100 nm). Surfaces of thus-obtained SOI wafers 39 were inspected under an optical surface analyzer (SP-1, product of KLA-Tencor Corporation) so as to observe sites of occurrence of scratches. Inspection of these SOI wafers 39 revealed that all wafers caused the streak-like scratches as shown in FIG. 10A.

Figure 10B:
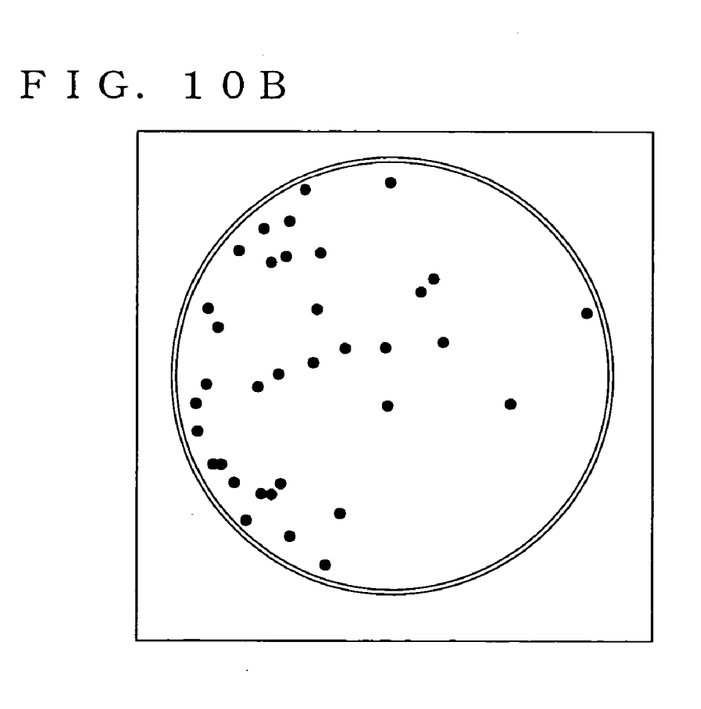
FIG. 10B is a drawing showing results of the surface inspection of the SOI wafer obtained by the separation method of this invention.

Next paragraphs will describe results of the experiment in which the SOI wafers 39 and the residual wafers 38 were separated using the wafer separation jig 1 of this invention shown in FIG. 3, according to the aforementioned method. All of other conditions are same as those described in the above. Results of observation on sites of occurrence of the scratches are shown in FIG. 10B. No scratches as found in FIG. 10A were detected on any SOI wafers 39 fabricated by the method of this invention. As is obvious from the results, adoption of the method of this invention is successful in fabricating the SOI wafers 39 almost without causing scratches thereon.

This invention is by no means limited to the embodiment described in the above, and of course allows any modifications without departing from the spirit of the invention. It is also to be noted that the attached drawings are only schematic expressions for the convenience of understanding.

What is claimed is:

1. A method of fabricating an SOI wafer comprising:
   an SOI wafer forming step for forming an SOI wafer by annealing the bond wafer having an ion-implanted layer formed therein and a base wafer on which an SOI layer is to be formed later, as being closely contacted with each other while placing in between an insulating film which composes the surficial portion of the bonding-side main surface of at least either one of the wafers, to thereby delaminate the surficial portion of the bonding-side main surface of the bond wafer at the ion implanted layer so as to form the SOI layer, and is bonded to the base wafer to thereby obtain an SOI wafer; and
   a wafer separation step in which a stack of the SOI wafer and the residual wafer which is a residue of the bond wafer after causing delamination, obtained in the SOI wafer forming step, is held so as to direct one wafer upward and the other wafer downward, and the upper wafer is then slid in the in-plane direction relative to the lower wafer, to thereby separate both wafers from each other, the SOI wafer is held as being immobilized, and the residual wafer is moved by sliding.

2. The method of fabricating an SOI wafer as claimed in claim 1, wherein in the wafer separation step, only the lower wafer is held as being immobilized, and the stack is inclined so as to allow the upper wafer to move by sliding as being driven by its own weight.

3. The method of fabricating an SOI wafer as claimed in claim 2, wherein a support having a first stopper on a supporting plane on which the lower wafer is supported, and the first stopper having a height adjusted so as to stop movement-by-sliding of the lower wafer, and so as to allow movement-by-sliding of the upper wafer relative to the lower wafer, is used, and
   the stack is inclined for separation while being placed on the supporting plane.

4. The method of fabricating an SOI wafer as claimed in claim 3, wherein the support has a second stopper disposed on the supporting plane and opposite to the first stopper while placing the lower wafer in between, being provided for stopping sliding down of the stack when inclined into the direction opposite to that for the wafer separation step.

5. The method of fabricating an SOI wafer as claimed in claim 4, wherein the support has a recovery portion for the upper wafer on the downstream side of the first stopper in the direction of the inclination for the separation, into which the upper wafer after the separation is recovered and held.

6. The method of fabricating an SOI wafer as claimed in claim 3, wherein the support has a recovery portion for the upper wafer on the downstream side of the first stopper in the direction of the inclination for the separation, into which the upper wafer after the separation is recovered and held.

7. A wafer separation jig for separating a stack composed of a pair of wafers stacked with each other, comprising
   a supporting plane on which the stack is supported in the thickness-wise direction, and a first stopper disposed on the supporting plane and having a height adjusted so as to stop movement-by-sliding of a lower wafer in the stack with respect to the jig, but so as to allow movement-by-sliding of an upper wafer relative to the lower wafer,
   and configured so as to allow both wafers to separate from each other when inclined with the stack placed on the supporting plane thereof so as to allow the upper wafer to move by sliding as being driven by its own weight in the in-plane direction relative to the lower wafer.

8. The wafer separation jig as claimed in claim 7, wherein the supporting plane has a second stopper disposed thereon opposite to the first stopper while placing the lower wafer in between, the second stopper being intended for stopping sliding down of the stack when inclined into the direction opposite to that for the wafer separation step.

9. The wafer separation jig as claimed in claim 8, further comprising a recovery portion for recovering and holding the upper wafer after the separation, so as to be disposed on the downstream side of the first stopper in the direction of inclination for the separation.

10. The wafer separation jig as claimed in claim 7, further comprising a recovery portion for recovering and holding the upper wafer after the separation, so as to be disposed on the downstream side of the first stopper in the direction of inclination for the separation.

* * * * *